US006872985B2

(12) United States Patent
Yap

(10) Patent No.: US 6,872,985 B2
(45) Date of Patent: Mar. 29, 2005

(54) WAVEGUIDE-BONDED OPTOELECTRONIC DEVICES

(75) Inventor: Daniel Yap, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/116,800

(22) Filed: Apr. 5, 2002

(65) Prior Publication Data

US 2003/0089915 A1 May 15, 2003

Related U.S. Application Data

(60) Provisional application No. 60/332,370, filed on Nov. 15, 2001.

(51) Int. Cl.[7] .............................................. H01L 29/16
(52) U.S. Cl. ......................... 257/82; 257/192; 257/194; 257/195
(58) Field of Search ............................ 385/31; 257/192, 257/194, 195, 777

(56) References Cited

U.S. PATENT DOCUMENTS 5,625,729 A * 4/1997 Brown ......................... 385/31

FOREIGN PATENT DOCUMENTS

| WO | 99/66613 | 12/1999 |
|---|---|---|
| WO | 01/29992 | 4/2001 |

OTHER PUBLICATIONS

Narayanan, A., et al., "High–Efficiency WaveguideCoupled λ=1.3 μm $In_xGa_{1-x}As$/GaAs MSM Detector Exhibiting Large Extinction Ratios at L and X Band", *IEEE Photonic Technology Letters*, vol. 5, No. 5, pp. 514–517 (1993).

Kato, K, et al., "PLC Hybrid Integration Technology and Its Application to Photonic Components", *IEEE Journal of Selected Topics in Quantum Electronics*, vol. 6, No. 1, pp. 4–13 (2000).

Tishinin, D. V., et al., "Vertical Resonant Couplers with Precise Coupling Efficiency Control Fabricated by Wafer Bonding", *IEEE Photonics Technology Letters*, vol. 11, No. 8, pp. 1003–1005 (1999).

Sakamoto, S. R., et al., "Substrate Removed GaAs–AlGaAs Electrooptic Modulators", *IEEE Photonics Technology Letters*, vol. 11, No. 10, pp. 1244–1246 (1999).

Chu, S. T., et al., "Wavelength Trimming of a Microring Resonator Filter by Means of a UV Sensitive Polymer Overlay", *IEEE Photonics Technology Letters*, vol. 11, No. 6, pp. 688–690 (1999).

London, Joanna M., et al., "Preparation of Silicon–on–Gallium Arsenide Wafers for Monolithic Optoelectronic Integration", *IEEE Photonics Technology Letters*, vol. 11, No. 8, pp. 958–960 (1999).

Hansen, D.M., et al., "Development of a Glass–Bonded Compliant Substrate", *Journal of Crystal Growth*, vol. 195, pp. 144–150 (1998).

(Continued)

*Primary Examiner*—David Nelms
*Assistant Examiner*—Mai-Huong Tran
(74) *Attorney, Agent, or Firm*—Ladas & Parry LLP

(57) ABSTRACT

An optoelectronic device and a method of making same. The optoelectronic device comprises a substrate, at least one dielectric waveguide in the substrate, and at least one active semiconductor layer physically bonded to the substrate and optically coupled to the at least one dielectric waveguide in the substrate, the at least one active semiconductor layer being able to generate light, detect light, amplify light or otherwise modulate amplitude or phase of light.

40 Claims, 4 Drawing Sheets

OTHER PUBLICATIONS

Alexe, M., et al., "Low Temperature GaAs/Si Direct Wafer Bonding", *Electronics Letters*, vol. 36, No. 7, pp. 677–678 (2000).

Little, B. E., et al., "Wavelength Switching and Routing Using Absorption and Resonance", *IEEE Photonics Technology Letters*, vol. 10, No. 6, pp. 816–818 (1998).

Alexe, M., et al., "Low Temperature GaAs/Si Direct Wafer Bonding," *Electronics Letters*, vol. 36, No. 7 (Mar. 30, 2000).

Chu, S.T., et al., "Wavelength Trimming of a Microring Resonator Filter by Means of a UV Sensitive Polymer Overlay," *IEEE Photonics Technology Letters*, vol. 11, No. 6, pp 688–690 (Jun. 1999).

Corbett, B., et al., "Low–Threshold Lasing in Novel Microdisk Geometries," *IEEE Photonics Technology Letters*, vol. 8, No. 7, pp 855–857 (Jul. 1996).

Corbett, B., "Spectral Characteristics of Low Threshold Microdisks;" *IEEE Lasers and Electro–Optics Society 1996 Annual Meeting*, vol. 2, pp 197–198 (1996).

Little, B.E., et al., "Ultra–Compact Si–$SiO_2$ Microring Resonator Optical Channel Dropping Filters," *IEEE Photonics Technology Letters*, vol. 10, No. 4, pp 549–551 (Apr. 1998).

Little, B.E., et al., Wavelength Switching and Routing Using Absorption and Resonance, *IEEE Photonics Technology Letters*, vol. 10, No. 6, pp 816–818 (Jun. 1998).

MacDonald, R.I., et al., "Hybrid Optoelectronic Integrated Circuit," *Applied Optics*, vol. 26, No. 5, pp 842–844 (Mar. 1, 1987).

Yanagisawa, M., et al., "Film–Level Hybrid Integration of AlGaAs Laser Diode with Glass Waveguide on Si Substrate," *IEEE Photonics Technology Letters*, vol. 4, No. 1, pp 21–23 (Jan. 1992).

Yi–Yan, A., et al., "GaInAs/InP pin Photodetectors Integrated with Glass Waveguides," *Electronics Letters*, vol. 27, No. 1, pp 87–89 (Jan. 3, 1991).

* cited by examiner

RESONATOR-ENHANCED MODULATOR W. COMPLEMENTARY OUTPUTS

OPTICAL FM DISCRIMINATOR

WAVEGUIDE-BONDED OPTOELECTRONIC DEVICES

CROSS REFERENCE TO RELATED APPLICATIONS

This application claims the benefit of U.S. provisional application No. 60/332,370 filed Nov. 15, 2001 for "Waveguide-Bonded Optoelectronic Devices" by Daniel Yap and Keyvan Sayyah, the disclosure of which is hereby incorporated herein by reference.

This application is related to a provisional patent application entitled "Agile RF-Lightwave Waveform Synthesis and an Optical Multi-Tone Amplitude Modulator" bearing Ser. No. 60/332,367 and filed Nov. 15, 2001, and its corresponding non-provisional application bearing Ser. No. 10/116,801 and filed on the same date as the present application, the disclosures of which are hereby incorporated herein by this reference. These related applications are owned by the assignee of this present application.

TECHNICAL FIELD

This invention relates a new class of guided-wave optoelectronic devices that provide low waveguide loss and efficient coupling to optical fibers while also being able to conduct electrical current as well as having electrically controlled parameters that can be changed rapidly. These devices are comprised of low-loss dielectric waveguides that are optically coupled to electronically active semiconductor elements that may provide functions such as in/out coupling and filtering of the guided light, absorption or generation of the light, and modulation of the amplitude and/or phase of the light. The devices, and photonic circuits containing those devices, are generally formed on a substrate that contains a network of dielectric waveguides, with the semiconductor elements being thin islands or appliques that are bonded onto the waveguide-containing substrate. Multiple active elements of different types may be coupled to the same waveguide network.

BACKGROUND OF THE INVENTION

Electronically active guided-wave optoelectronic devices, such as lasers, photo-detectors and electroabsorption modulators fabricated from semiconductor materials, are able to conduct electrical current and transduce signals between the electrical and optical domains. These devices typically have high optical-propagation loss and couple poorly to optical fibers. Lenses are typically used to reduce the fiber-coupling loss. However, the need for lenses complicates the assembly/packaging procedure and greatly increases component costs. Electronically passive waveguides are preferably fabricated in dielectric materials, such as silica or lithium niobate, since they enjoy an order-of-magnitude lower propagation loss and because they couple efficiently with optical fibers. However, it generally is not possible to fabricate electronically active optoelectronic devices in dielectric materials, since they are insulators. Only optical filters with fixed response and modulators/switches based on temperature change or the electro-optic effect (which depends on an applied voltage rather than current) have been demonstrated in dielectric waveguides. The present invention can lead to the realization of electronically active guided-wave devices, such as those listed above, with dielectric waveguides that are low loss and have efficient coupling to optical fibers.

Many advanced optoelectronic devices and integrated photonic circuits, such as mode-locked lasers or optoelectronic transceivers, consist of various electronically active devices that are interconnected by passive waveguide networks. In general, the waveguides in these advanced devices are fabricated from a semiconductor material and thus tend to have a substantially higher loss and poorer coupling to optical fiber than do dielectric waveguides. In the prior art, in which the active devices are interconnected by dielectric waveguides, separate substrate chips of semiconductor or waveguide material must be optically aligned and properly butted against each other or coupled through optical lenses in order to function. The packaging effort associated with this method of combination is costly. The present invention achieves the integration of semiconductor active devices and dielectric waveguide networks on a single substrate. Also, multiple devices, each of which could contain multiple active elements, can be fabricated on a given substrate.

An example of a prior-art electronically active device that monolithically integrates a semiconductor waveguide with a photodetector is described in *IEEE Photonics Technology Letters*, v.5, pp. 514–517 (1993). The photodetector of this device is located above a portion of the semiconductor waveguide. The interface region between the photodetector and the waveguide layers is controlled because that interface region is produced as part of the single epitaxial growth for both the photodetector and waveguide materials. This approach has the disadvantage previously discussed above because it uses a semiconductor waveguide.

Examples of prior-art approaches for butt coupling of dielectric waveguides with lasers or photodetectors that are comprised of separate, complete chips are described in *IEEE J. Selected Topics in Quantum Electronics*, v. 6, pp. 4–13 (2000). A large variety of components have been realized with this approach. The difficulties of this approach are discussed above.

A prior-art approach that could be used to fabricate an electronically active waveguide device involves directly bonding two pieces of semiconductor materials. One piece contains fabricated semiconductor waveguides and the other piece could contain the active element. This approach is described in *IEEE Photonics Technology Letters*, v. 11, pp. 1003–1005 (1999). In this example, two semiconductor waveguides are bonded to a semiconductor microdisk resonator. The two semiconductor pieces are directly bonded together at high temperature (750° C. for GaAs materials and 400° C. for InP based materials). This approach also has the disadvantage previously discussed above because it uses a semiconductor waveguide.

A prior-art approach that could be used to bond thin electronically active device elements onto dielectric substrates is described in *IEEE Photonics Technology Letters*, v. 11, pp. 1244–1246 (1999). According to this approach, partially processed active device elements are bonded onto a carrier or transfer substrate by using a layer of organic polymer. Although GaAs was used as the transfer substrate in this prior-art example, other substrates such as quartz also could be used. In this example, the active device element is a guided-wave modulator that is based on semiconductor waveguides. The active device element is flipped top-side down above the transfer substrate. The top-side metal electrodes are fabricated on the active-device piece before it is bonded onto the transfer substrate and thus are located between the active-device epilayers and the transfer substrate. The semiconductor growth substrate for the active device element is then etched away and back-side metal electrodes are fabricated. In contrast to this prior-art approach, the present invention forms both the top-side and back-side metal electrodes after the active device pieces are bonded onto the dielectric waveguide material. This is because the interface between the active device piece and the dielectric-waveguide substrate of the present invention is used to couple light between the active device element and the dielectric waveguide and thus should be controlled carefully. The prior art approach does not involve coupling of light between the active device element and the transfer substrate (the substrate to which the active epilayer is attached temporarily).

Some of the examples of new devices that can be realized by the approach of the present invention involve microresonators whose properties are adjusted electrically. The closest prior art makes use of modifying a polymer overlay that is deposited above the microresonator to irreversibly trim the resonant wavelength of the microresonator. This prior-art approach is described in *IEEE Photonics Technology Letters*, v. 11, pp. 688–690 (1999). An advantage of the present approach over the prior art is that the electrical adjustment is reversible.

BRIEF DESCRIPTION OF THE INVENTION

In one aspect, the present invention provides an optoelectronic device having a substrate; at least one dielectric waveguide in the substrate; and at least one active semiconductor layer physically bonded to the substrate and optically coupled to the at least one dielectric waveguide in the substrate, the at least one active semiconductor layer being able to generate light, detect light, amplify light or otherwise modulate amplitude or phase of light.

In another aspect, the present invention provides a method of making an optoelectronic device comprising: providing a first substrate; forming at least one dielectric waveguide in the first substrate; providing a second substrate having layers or islands of semiconductor material grown thereon; bonding an upper most layer of the second substrate onto an exposed surface of the first substrate; and etching at least portions of the layers or islands of semiconductor material initially grown on the second substrate to define at least one active device, the at least one active device being physically bonded to the first substrate and optically coupled to the at least one dielectric waveguide in the first substrate.

DESCRIPTION OF THE DRAWINGS

FIG. 2b is a perspective view of a single microresonator device used in the encoder of FIG. 2a;

FIG. 3c is a perspective view of microresonator filters and photodetectors used in the discriminator of FIG. 3a.

DETAILED DESCRIPTION

Figure 1:
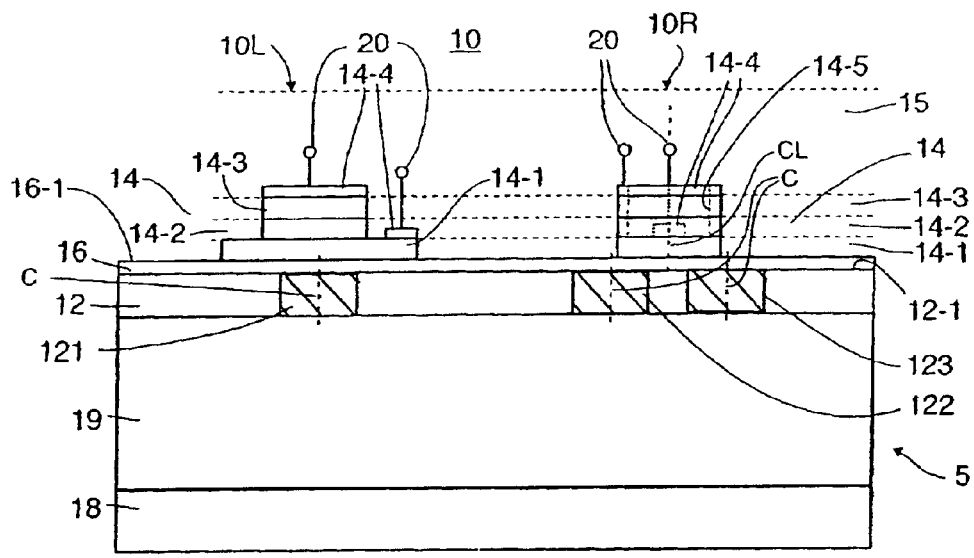
FIG. 1 provides a view of a basic embodiment of the invention.

FIG. 1 is a side elevation view through two devices 10L and 10R and their associated waveguides 121, 122 and 123.

Two different embodiments of a waveguide-bonded optoelectronic device 10 are depicted. The device on the left hand side (10L) is a detector while the device on the right hand side (10R) is a disk-shaped mircoresonator 102 (see also FIG. 2b). Each of the devices 10R and 10L of the waveguide bonded optoelectronic devices are associated with at least one dielectric optical waveguide 121, 122, 123 in a waveguide layer 12 which is optically coupled with one or more electrically active semiconductor elements 14 defining, for example, devices 10L and 10R. The dielectric waveguides 121, 122, 123 guide light because the optical refractive index in the waveguides is higher than the optical refractive index of the surrounding material 12, 119. Waveguide layer 12, including optical waveguides 121, 122, 123, are preferably constructed from a dielectric material such as $SiO_2$ with the waveguides being suitably doped. The waveguide layer 12 is formed in a substrate 5. Elements 14 can be of different types, and perform different functions, such as generation of light (e.g. lasers), absorption and detection of light (e.g. photodetectors), and modulation of light (e.g. electroabsorption modulators). One or more optional bonding interface layers 16 can be located between the waveguide layer 12 and the semiconductor elements 14. The functions of these one or more interface layers 16 can include (i) promoting the bonding between the semiconductor elements 14 and the surface 12-1 of layer 12 containing the dielectric optical waveguides 121, 122, 123 and (ii) assisting to optically couple light between the waveguides 121, 122, 123 and their associated active elements 14. The layer 12, containing the dielectric optical waveguides, can be located above a separate backing substrate 18, which can be comprised of materials such as silicon, alumina or quartz. Electrical contacts 20 to the active semiconductor elements 14 are preferably located on the sides of the elements 14 that face away from the dielectric waveguides 121, 122, 123.

In FIG. 1 only two devices 10 and only three waveguides 121, 122, 123 are depicted for ease of illustration. In practice, many more devices and waveguides will likely be utilized at a given time in a given embodiment.

In FIG. 1 the semiconductor element 14 of device 10L is preferably centered on its associated waveguide 121 whereas device 10R straddles two waveguides 122 and 123. Preferably, the centers C of the waveguides 122 and 123 are equally spaced from a centerline CL of device 10R if equal coupling between the semiconductor element 14 of device 10R and its two associated waveguides 122 and 123 is desired. In some embodiments, non-uniform coupling may be desirable, in which case the center C of one optical waveguide may approach the centerline CL of device 10R more closely than does the center of the other optical waveguide.

The substrate 5 carrying dielectric optical waveguides 121, 122, 123 and the epitaxial materials for the active semiconductor elements 14 are fabricated separately. Initially, semiconductor epitaxial materials 14-1, 14-2 and 14-3 are grown on another semiconductor substrate 15, comprised of compounds such as GaAs or InP, in order to fabricate the active semiconductor elements 14. The resulting piece(s) of active semiconductor material is (are) then mounted top-side down onto the top surface 12-1 of the dielectric waveguide layer 12 or top-side down onto the top surface 16-1 of the optional interface layers 16 (if utilized) and are used to form semiconductor elements 14. Thus, the upper-most (as grown) active semiconductor layer 14-1 is placed in close contact either with the dielectric waveguide layer 12 directly or its associated interface layer 16. This close contact is desirable because, in use, light will be coupled between the dielectric optical waveguide in layer 12 and the semiconductor layers 14-1, 14-2 and 14-3 of an associated semiconductor element 14.

Various bonding approaches, to be described later, can be used to bond the semiconductor pieces onto the surface 12-1 of waveguide layer 12, or the optical interface layer surface 16-1. The bonded pieces are shown by the solid and dashed lines defining semiconductor layers 141, 14-2 and 14-3 and defining substrate 15 in FIG. 1. As will be soon described, after one or more semiconductor pieces are bonded in place, the semiconductor substrate material 15 is removed from those piece(s), leaving the epitaxial material needed for the active semiconductor elements 14, which are defined or further defined using conventional semiconductor processing techniques to remove the dashed line portions shown in FIG. 1. Thus, in FIG. 1, the bonded pieces are shown by solid and dashed lines, while the semiconductor elements formed therefrom are shown by solid lines. The numeral 14 is used to refer to the semiconductor elements generally and also to the layered semiconductor piece(s) from which the elements are formed.

An example of epitaxial semiconductor materials which might be used is the epitaxial semiconductor layers 14-1, 14-2, 14-3 of a PIN diode structure of a laser, photodetector or modulator. The components of epitaxial semiconductor layers 14-1, 14-2, 14-3 may be identical to those of conventional semiconductor guided-wave devices. The thicknesses of semiconductor layers 14-1, 14-2, 14-3, however, generally are different since those layers are optically coupled to a dielectric optical waveguide in layer 12 rather than to a semiconductor waveguide. The design and growth of layers 14-1, 14-2, 14-3 involve known principles and techniques and therefore those matters are not discussed further here. However, it should be noted that layer 14-3 is the P layer, while layer 14-2 is the I layer and layer 14-1 forms the N layer of the PIN diode structure.

The dielectric optical waveguide layer 12 is formed in substrate 5. In addition to the waveguide layer 12, substrate 5 can include multiple layers 18, 19 (the top most layer 19, which is in contact with waveguide layer 12, must be a dielectric material) or it can be monolithic (that is, comprise a single layer of dielectric material). In one embodiment, one layer 18 is silicon while layer 19 is preferably $SiO_2$ having a thickness, for example, of about 30 $\mu$m. Waveguides in layer 12 are doped $SiO_2$. Layer 12 may have a thin optional layer of undoped $SiO_2$ immediately adjacent optional interface layer 16 (if utilized). In another embodiment, the optical waveguides in layer 12 are Ti-doped lithium niobate while layers 18 and 19 are preferably formed by a single layer of undoped lithium niobate.

The one or more semiconductor pieces 14 bonded to the surface 12-1 (if no layer 16 is utilized) or to the interface surface 16-1 (if one or more layers 16 are utilized) of the dielectric waveguide substrate 5 are then processed to fabricate active elements of the devices. This processing typically involves steps such as photolithographic definition, etching of the semiconductor materials, deposition and patterning of additional dielectric films, deposition of metal films 14-4 (for the electrical contacts) and annealing or sintering. Such steps are known in the art and are used commonly in the fabrication of the standard semiconductor guided-wave devices. Some of these processing steps could involve exposure to vacuum pressures and high temperatures (exceeding 400° C.). The bonding technique used to attach the semiconductor pieces 14 to the dielectric waveguide surface must produce a bond that can survive this additional processing.

Figure 1A:
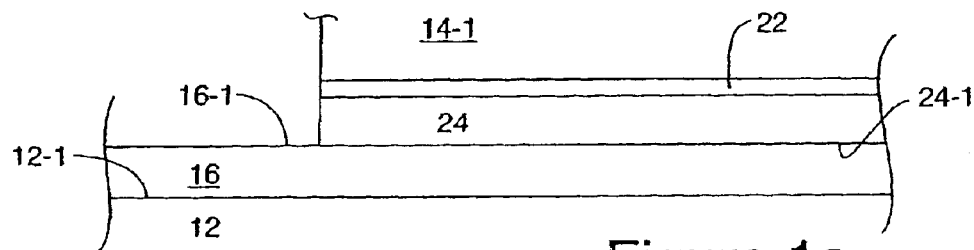
FIG. 1a is a detailed view of three interface layers between an active device and a dielectric waveguide for mounting the active device to the dielectric waveguide.

Various known bonding methods may be used to bond the semiconductor pieces 14 onto the dielectric waveguide surface 12-1 or interface surface 16-1 (if optional layer 16 is utilized). As previously mentioned, the dielectric waveguide layer 12 is typically fabricated from a material such as silicon dioxide or lithium niobate (another oxide). Before bonding, the exposed waveguide layer surface 12-1 or 16-1 may be polished to ensure that it is flat and cleaned to remove any particles or residue. Similarly, the upper layers 14-1 of the semiconductor pieces are preferably cleaned. The surfaces of those pieces 14 usually will be flat already. One bonding method is described in IEEE Photonics Technology Letters, v. 11, pp. 958–960 (1999). When this method is used to fabricate the devices of this invention, thin films of silicon nitride 22 followed by silicon dioxide 24 are deposited on the upper layer 14-1 of the semiconductor pieces (which, in this embodiment, are preferably formed by GaAs or GaAs compatible materials) before bonding. These layers of silicon nitride 22 and silicon dioxide 24 are not shown in FIG. 1, but can be seen in the more exploded view of FIG. 1a. A thin film 16 of borophosphosilicate glass (BPSG) is preferably deposited on the exposed optical waveguide surface 12-1 of the dielectric waveguide layer 12. The surfaces 16-1 and 24-1 of the BPSG 16 and the silicon dioxide 24, respectively, are cleaned and then brought into contact under pressure at room temperature so that a hydrophilic bond is formed between them. FIG. 1a is a detailed view showing the two films 22 and 24 formed on layer 14-1 and also showing the mating of surface 24-1 with surface 16-1. The substrate, including the mounted pieces 14, is then annealed to a sufficiently high temperature that the bond is strengthened. Temperatures of 150 to 250° C. may used for this anneal. The films 22 and 24 of, for example, deposited silicon nitride and silicon dioxide preferably have thicknesses on the order of tens of nm, and hundreds of nm, respectively. The film 16 of BPSG preferably has a thickness on the order of hundreds of inn. The precise thicknesses chosen would depend on the specific fabrication steps used for the active semiconductor elements 14 and the specific design of the optical waveguides in layer 12 and the active semiconductor elements 14, since these interface layers 16, 22 and 24 affect the coupling of light between the optical waveguides in layer 12 and their associated active semiconductor elements 14. The thicknesses of the layers of BPSG, $SiO_2$ and SiN, in this particular embodiment, are adjusted so that their light refracting indexes are used to spread the light between the optical waveguides 121, 122, 123 the semiconductor devices 14.

Another bonding technique makes use of a film of borosilicate glass (BSG) to achieve the bonding. This approach is described in J. Crystal Growth, v. 195, pp. 144–150 (1998). When this approach is used, the BSG film is preferably deposited on both the separately grown semiconductor pieces 14 and the dielectric optical waveguide layer 12. The bonding temperature is about 550° C., with mechanical pressure being applied to hold the semiconductor piece(s) 14 against the BSG layer 16 deposited on the dielectric optical waveguide layer 12. Despite its higher bonding temperature, this method still can be used for the present invention since that temperature still is substantially below the growth temperature for the epitaxial layers of the semiconductor piece(s) 14. Therefore, those epitaxial materials will not be degraded by the bonding process.

Still another bonding technique appropriate for the present invention makes use of spin-on glass (SOG) as the interface material. This approach is described in Electronics Letters, v. 36, pp. 677–678 (2000). The SOG film may be deposited on either surface, but it may be more convenient to deposit that film on the optical waveguide layer 12. Typical SOG film thicknesses are in the hundreds of nm. The bonding is done at room temperature and the substrate supporting the piece(s) 16 is annealed at temperatures ranging from 200–225° C.

Two examples of waveguide-bonded optoelectronic devices utilizing the present invention will now be discussed. The first device is a wavelength selective amplitude encoder. Such an encoder may be used to form an optical-frequency filter with a shaped frequency response. A block diagram of this shaped filter is shown in FIG. 2a. This device is also described, for use in a specific application, in U.S. Provisional Patent Application Serial No. 60/332,370 filed Nov. 15, 2001 and its and its corresponding non-provisional application bearing Ser. No. 10/116,800 filed on the same date as the present application. The shaped filter consists of an optical waveguide trunk 100 that is coupled to a sequence of microresonator elements $102_1, 102_2 \ldots$ (the subscripts are used to identify particular ones of the elements 102 in the sequence). Each microresonator element $102_1, 102_2, \ldots$ is coupled to an associated outlet waveguide segment $106_1$, $106_2$ Each microresonator element $102_1, 102_2$, couples light of a selected range of frequencies from the waveguide trunk 100 into its associated outlet waveguide $106_1, 106_2 \ldots$ The frequency band and the amount of light coupled out can be adjusted electrically. The electrical adjustment is accomplished by applying control voltages to the microresonator elements 102, which functions as a waveguide-coupled electroabsorption modulator, via its control line $104_1$, $104_2 \ldots$ The frequency band is controlled by controlling the length of time it takes light to travel the circumference of the microresonator, which is done by applying a voltage across the contacts 20 depicted in FIG. 1, so each control line 104 could be implemented by a pair of wires coupled to the contacts 20 of each microresonator 102.

Figures 2C, 2D:
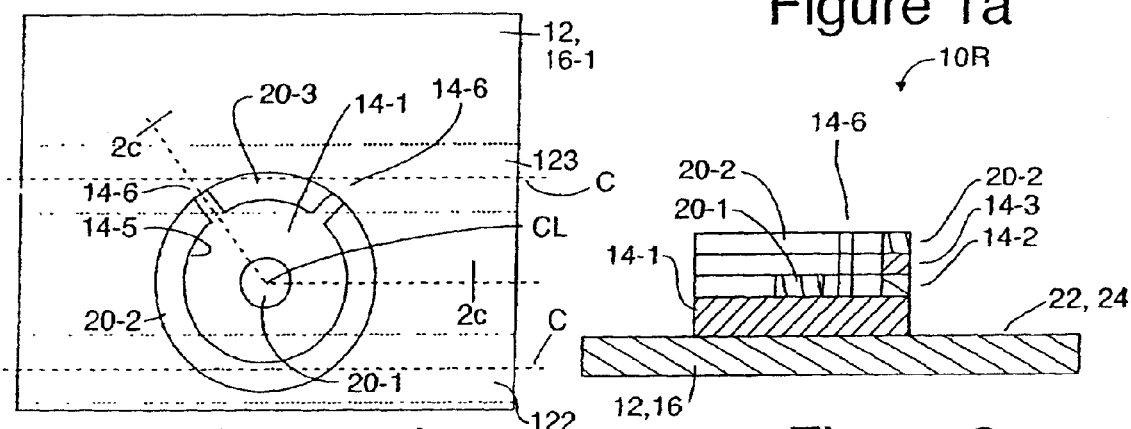
FIG. 2c is a section view though a split-ring version of a single microresonator.
FIG. 2d is plan view of the split-ring version of the single microresonator of FIG. 2c.
Figure 2A:
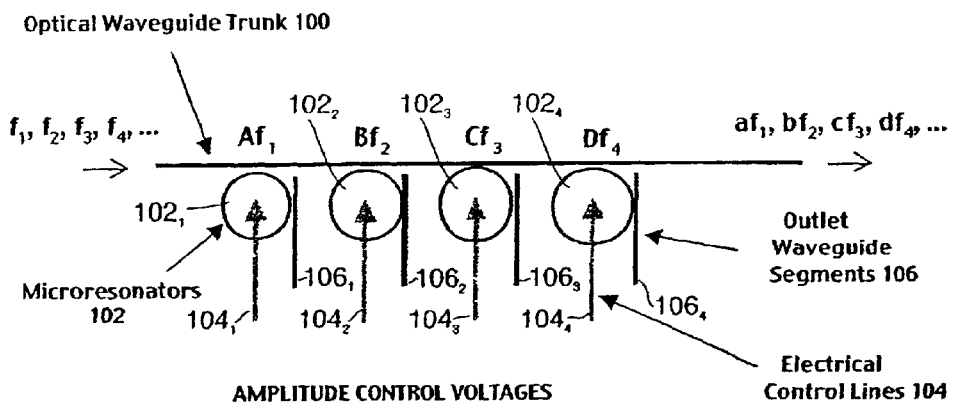
FIG. 2a is block diagram of a wavelength selective amplitude encoder that may be used to form an optical-frequency filter with shaped frequency response.
Figure 2B:
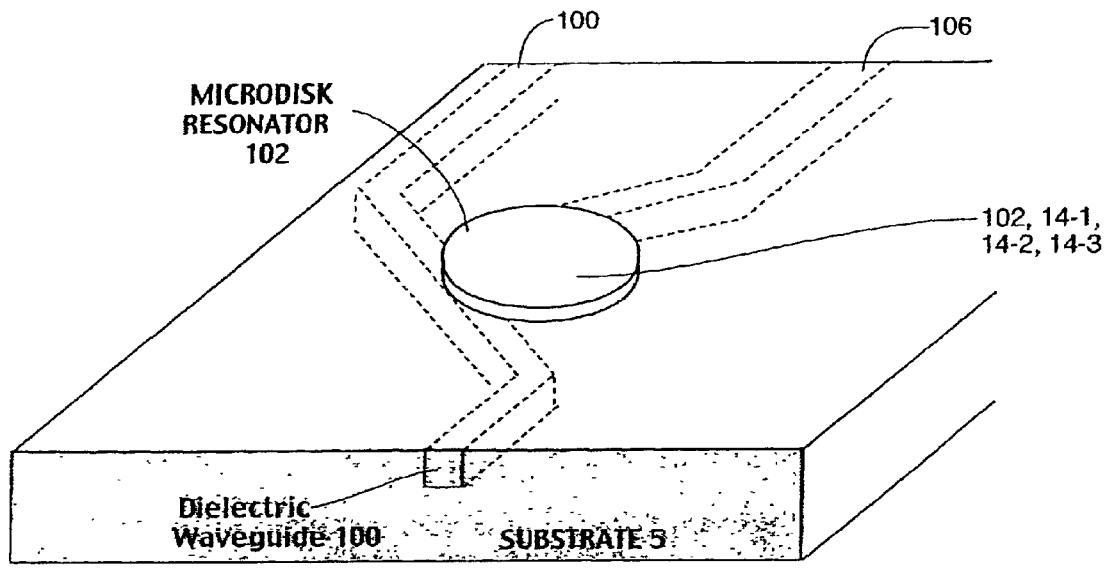

A single microresonator element 102 is illustrated in FIG. 2b and it can be considered a resonator-enhanced optical modulator that has complementary outputs. The size of the microresonator 102 and the refractive index of its resonant optical mode determine the resonant frequency of the microresonator element 102, which is the frequency of the light that is coupled out by that element 102. Typically a number of microresonator elements 102 are used cooperatively (as shown by FIG. 2a) and would be disposed on a single substrate 5 having optical waveguides therein (as such optical waveguides 100 and 106 shown in FIG. 2b or optical waveguides 121, 122 or 123 shown in FIG. 1).

The encoder's optical waveguide trunk 100 is coupled optically to multiple circular microresonators 102 (only one circular micro-resonator 102 is shown in FIG. 2b, it being understood that typically a number of circular microresonators 102 would preferably be formed on substrate 5 and coupled as shown by FIG. 2a). Each micro-resonator 102 has a slightly different diameter. One or more electrical control lines 104 are supplied to each of the microresonators 102. The control signals on these lines 104 adjust the optical refractive index and/or the optical absorption of the semiconductor layers in the at least one of the associated microresonator 102. Optional outlet waveguide segments 106 can be optically coupled to each of the microresonators 102. Light incident of the optical waveguide trunk 100 is in the form of multiple RF tones($f_1, f_2, f_3, f_4, \ldots$) that are amplitude modulated onto a single-wavelength lightwave carrier. Each tone has a specific lightwave frequency and generally both upper and lower amplitude-modulation sidebands would be represented in the comb. Light exiting the optical waveguide trunk is comprised of the same tones but the amplitudes of those tones have been adjusted by different weights (a, b, c, d, . . . ). These weighing factors a, b, c, d, . . . are all less than or equal to unity unless the resonator has gain, in which case the weighing factors a, b, c, d, are less than, equal to or greater than unity. Gain is obtained by making layer 14-2 (see FIG. 1) generate light. For example, GaInAs/InAlAs multiple quantum wells or GaInAsP can be used for generating light at wavelengths near 1550 nm.

The microresonator element 102 preferably has a PIN structure. In one example, layer 14-3 is the P layer, while layers 14-2 and 14-1 form the I and N layers, respectively, of the PIN device. Layer 14-3 is doped p-type and a p contact is made above it by depositing an appropriate metal contact metalization layer 14-4. Layer 14-2 is comprised of lightly doped, undoped or intrinsic material. Layer 14-1 of the semiconductor material at the bottom of disk 102 is doped n-type and the N-contact is made to an exposed portion of layer 14-1 by depositing an appropriate metalization layer 14-4. The microresonator 102 formed by layers 14-1 through 14-4 corresponds to device 10R of FIGS. 1, 2c and 2d. The refractive index of the optical mode guided in the combined structure including the microresonator element 102 and the waveguide 180 can be changed by applying a voltage to the PIN structure of the electroabsorption modulator element as a result of the electro-refraction properties of the semiconductor material. The amount of light coupled out from the waveguide trunk 100 can be changed by adjusting the optical absorption of the microresonator element 102. The use of absorption in a resonator to control the optical coupling between the resonator and a waveguide is discussed in *IEEE Photonics Technology Letters*, v.10, pp. 816–818 (1998). As the absorption is increased, more of the light bypasses the microresonators 102 and remains in the waveguide trunk 100.

The disk-shaped microresonator device 10R of FIGS. 1, 2c and 2d is preferably annular shaped in that at least the P layer (14-3) and its contact 20 has an annular opening 14-5 therein. The annular opening 14-5 preferably stops at layer 14-1, but may optionally penetrate to layer 16 or stop at intervening layer 14-2. FIGS. 2c and 2d show a modified structure where the ring PIN structure is split into two associated devices by notches 14-6. As such, layer 14-3 is divided into two portions which are aligned below their associated metal contact layer portions 20-2 and 20-3. The notches 14-6 penetrate the P layer 14-3. This notched embodiment can be conveniently used with the embodiment of FIG. 2b with the bias applied to contact layer portions 20-2 and 20-1 controlling the operating frequency and the bias applied to contact layer portions 20-3 and 20-1 by control lines 104 (see FIG. 2a) controlling the amplitude of the optical signal in waveguide 100 which is dumped into outlet waveguide segment 106. In FIG. 2d the relatively smaller semiconductor device (as noted by its relatively smaller metal contact 20-3) is arranged toward outlet waveguide segment 106.

In FIGS. 2a and 2b the optical waveguide truck is identified by numeral 100 while the segments into which light is dumped are identified by the numerals 106. In FIGS. 1 and 2d the waveguides are identified by the numerals 122 and 123. When the embodiments of the microresonators 10R of FIGS. 1, 2c and 2d are used in the application of FIGS. 2a and 2b, then waveguide 122 is equivalent to waveguide 100 while waveguide 123 is equivalent to waveguide 106.

Figure 3A:
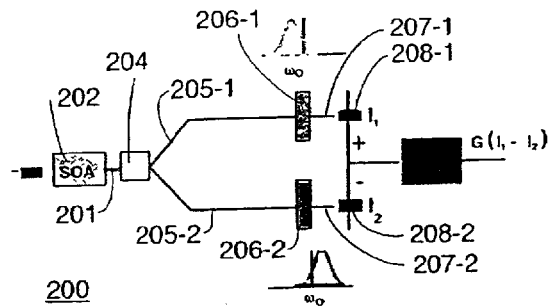
FIG. 3a is a schematic diagram of an all-optical discriminator for an optical frequency modulation receiver.
Figure 3C:
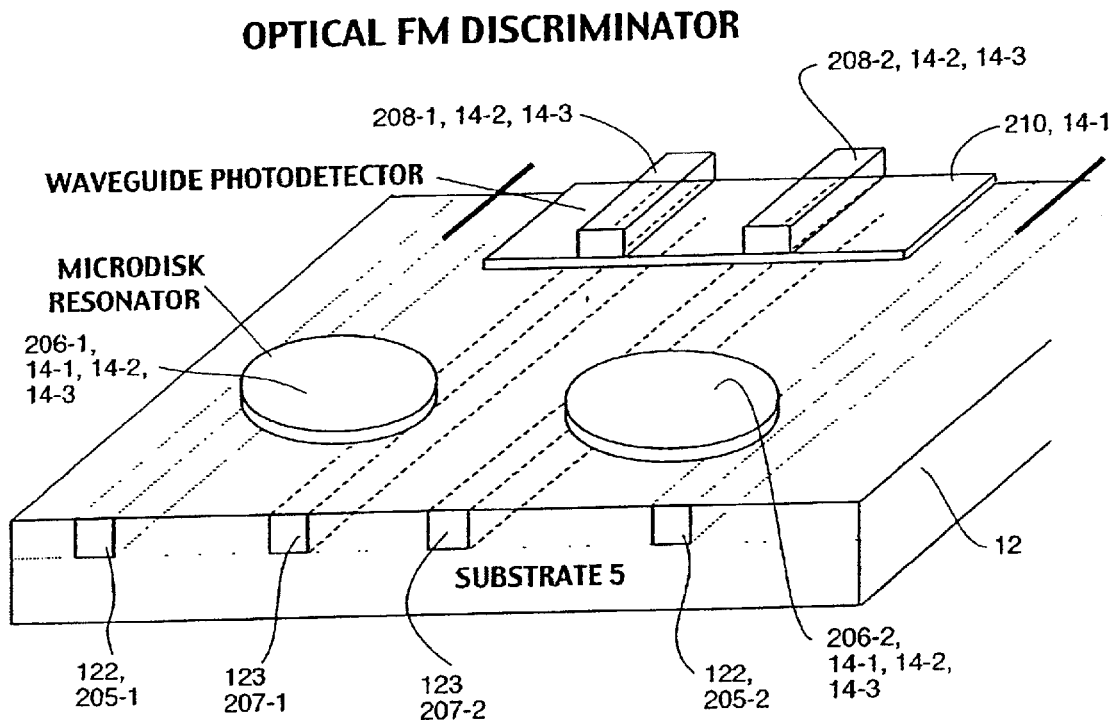
Figure 3B:
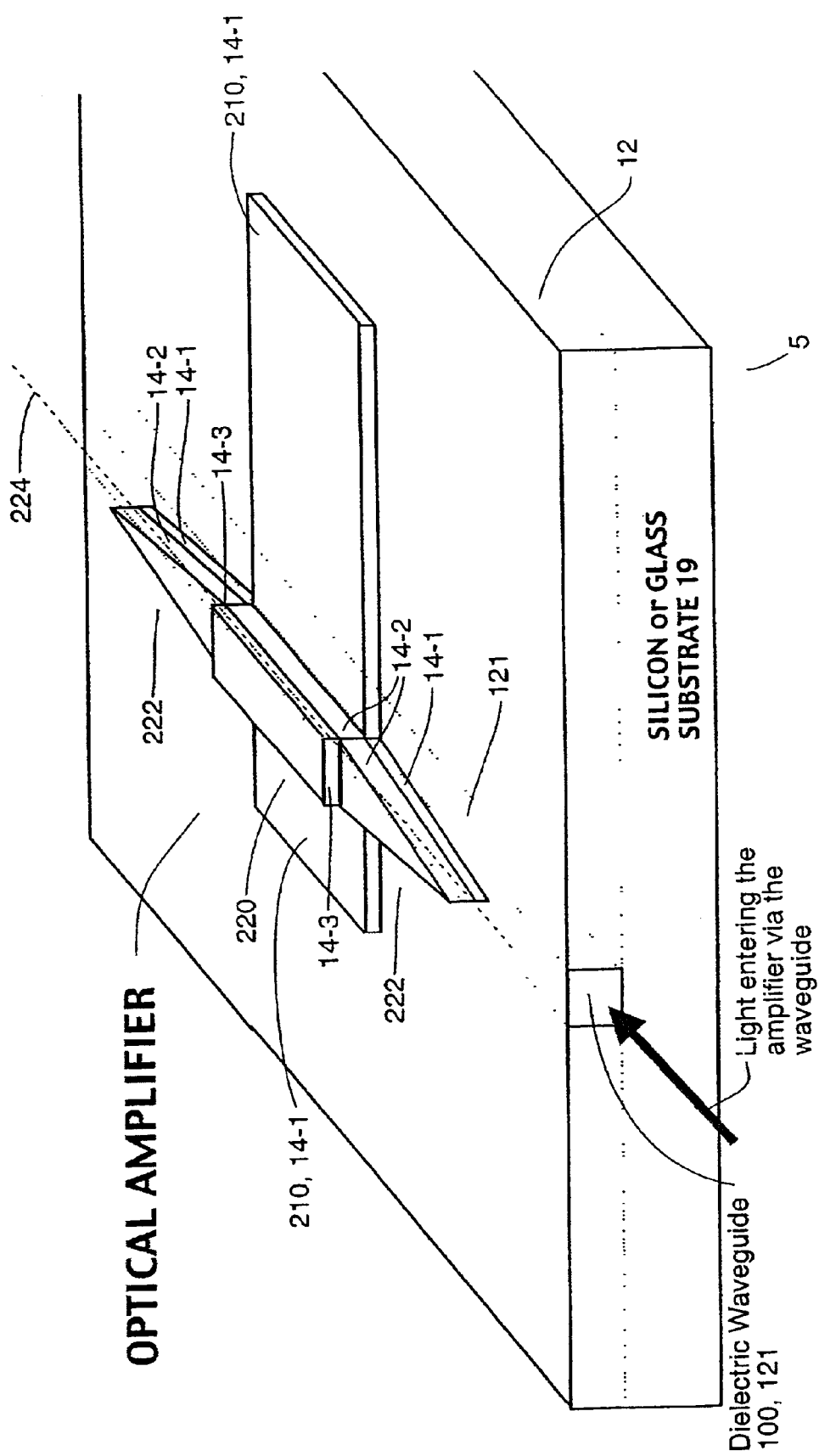
FIG. 3b is a perspective view of an optical amplifier.

Another example of a waveguide bonded optoelectronic device is an all-optical discriminator 200 for an optical frequency-modulation receiver. This discriminator 200 is illustrated in FIG. 3a. The basic idea for this discriminator is described in PCT Application No. PCT/US00/23935 published as WO/01/29992 A1 on Apr. 26, 2001. The input frequency-modulated (FM) light is first amplified by a semiconductor optical amplifier (SOA) 202 and then is divided into two paths by an optical-waveguide splitter 204. Light in each path is passed through a separate frequency (or wavelength) filter 206-1, 206-2 whose center frequency is shifted by a pre-set amount to a higher (see the small bandpass graph for filter 206-1) or lower optical frequency from the center frequency of the input FM signal. The filtered light is then sensed by two photodetectors 208-1 and 208-2 that are connected electrically in a differential configuration. The SOA 202, the filters 206 and the photodetectors 208 contain active semiconductor elements as well as waveguides. The waveguide network consists of an input section 201, the splitter 204, and the interconnect segments 205-1 and 205-2 between the splitter 204 and the filters 206-1 and 206-2 as well as the interconnect segments 207-1 and 207-2 between the respective filters 206-1 and 206-2 and the respective photodetectors 208-1 and 208-2. The metalization contacts 20 as shown in FIGS. 1, 2c and 2d would be utilized, but are not shown in this view for ease of illustration. The filters 206 can be implemented by the microdisk resonators previously discussed with reference to FIGS. 1 (device 10R), 2a, 2b, 2c and 2d and made using the manufacturing techniques discussed herein. If a resonator of type shown in FIGS. 2c and 2d is used for each filter 206-1 and 206-2, then, as shown by FIG. 3c, filter input waveguides 205-1 and 205-2 would be formed by the waveguide 122 of each filter and filter output waveguides 207-1 and 207-2 would be formed by the waveguide 123 of each filter. The SOAs 202 can also be implemented and made using the devices and manufacturing techniques discussed herein (see device 10L in FIG. 1, for example, and the device discussed with reference to FIG. 3b below). FIG. 3b depicts a semiconductor optical amplifier (SOA) which can be easily made in accordance with the techniques described above. It is yet another example of a waveguide bonded optoelectronic device. The semiconductor element of the amplifier sits atop, and is preferably longitudinally centered on, waveguide 121. The main body portion 220 has P, I and N layers 14-3, 14-2 and 14-1, respectively, as also has the devices 10L and 10R of FIG. 1. The N layer 14-1 is preferably formed as a wide slab 220 with layers 14-2 and 14-3 forming mesas thereon. These layers may be conveniently made using the techniques discussed above with reference to FIGS. 1 and 1a. The SOA of this embodiment also preferably has tapered portions 222 which comprise a portion of the N layer (and may also include a portion of the I layer as well—as is depicted in FIG. 3b—and may further include a portion of the P layer—which is not shown in the figure). The tapered portions 222 have a longitudinal axis 224 which preferably aligns with the longitudinal centerline of the main body portion 220 and with the centerline C of waveguide 121 (see also FIG. 1). The N layer of the slab and the N layer of the tapered portions 222 are preferably defined in a single etching process.

An implementation of the filters 206 and photodetectors 208 of FIG. 3a is shown in FIG. 3c. The filters 206 are implemented as microresonator-coupled waveguides 205-1 and 205-2 that can be tuned electrically. This permits the discriminator to be adjusted actively to track any changes to the center frequency of the FM signal. Also, the adjustment of the microresonators permits corrections to be made to any fabrication-related offsets in the filter performance. Again, each microresonator 206 performs optical modulation and has a structure like the structures described with reference to FIGS. 1 (device 10R) and 2b–2d. However, in the present case, layer 14-2 is not made of a material that is electro-absorptive at the optical wavelength, but rather is electro-refractive or electro-optic. Thus, the refractive index of layer 14-2 changes as the voltage applied to that layer changes. The photodetectors 208 consist of semiconductor PIN diode structures 14 that are disposed above a waveguide 207-1, 207-2 in optical waveguide layer 12. Light is coupled out of the resonators 206 through waveguide sections 207-1 and 207-2 and absorbed in layer 14-2 the photodetectors 208-1 and 208-2 (generally in the I layer of the diode). Known techniques can be used to design such a waveguide-coupled photodetector. Each photodetector 208 looks like a mesa 14-2, on a wide 14-3 slab 210 of N type material that is located above a dielectric waveguide 207-1, 207-2. The P and I semiconductor layers 14-2, 14-3 as well as the top contact comprise the mesa. The N layer 14-1 and the bottom contact comprise the slab. There may be an additional "index-matching" layer located underneath the N layer of the diode to adjust the spread of the optical mode between the dielectric optical waveguide and the layers.

A detailed drawing of the SOA 202 is given in FIG. 3b. The SOA 202, like the PIN photodetector 208 has a PIN diode configuration. However, the semiconductor element of the SOA 202 is comprised of different epitaxial layers of different layer thicknesses than those of semiconductor element of the photodetector element 208. The types of material of these layers are common to the ones found in conventional SOA devices. Since light is coupled both from the dielectric waveguide into semiconductor layers of the SOA and out of semiconductor layers of the SOA into the dielectric waveguide, it is beneficial to form waveguiding transition regions as an etched taper 222 in the SOA semiconductor layers. Such tapered structures are used for conventional SOAs that contain semiconductor waveguides. The design of the SOA is based on known techniques. This SOA and indeed all of the waveguide bonded optoelectronic devices disclosed herein are different from the prior art in that an active semiconductor element preferably based on a PIN structure cooperates with and receives light from, sends light to, or exchanges light with a dielectric optical waveguide rather than with a semiconductor waveguide.

The examples described above should provide an indication of the utility and versatility of the present invention. Obviously, many more devices can be developed that involve combinations of waveguides, waveguide networks, waveguide splitters, couplers and interferometers with active device elements such as modulators, photodetectors, optical amplifiers and lasers, all of which all can benefit from the ability to use semiconductor active regions which cooperate with one or more dielectric waveguides. As such, the invention as set forth in the appended claims is not to be limited to the particular embodiments disclosed, except as specifically required by the appended claims.

What is claimed is:

1. An optoelectronic device comprising:
   a. a substrate;
   b. at least one dielectric waveguide in the substrate; and
   c. at least one semiconductor layer physically bonded to the substrate and optically coupled to the at least one dielectric waveguide in the substrate, the at least one active semiconductor layer being able to generate light, detect light, amplify light or otherwise modulate an amplitude, phase and/or frequency of light.

2. The optoelectronic device of claim 1 wherein the at least one semiconductor layer has adjacent layers of P, I and N material.

3. The optoelectronic device of claim 2 wherein the N material layer is closer to the at least one dielectric waveguide in the substrate than is the P material layer.

4. The optoelectronic device of claim 1 wherein the at least one semiconductor layer is disk-shaped.

5. The optoelectronic device of claim 4 wherein the at least one dielectric waveguide in the substrate includes an inlet waveguide and an associated outlet waveguide.

6. The optoelectronic device of claim 5 wherein the outlet waveguide is arranged close to, but spaced from the inlet waveguide in the substrate and wherein the disk-shaped device is disposed over or immediately adjacent both the inlet waveguide in the substrate and the outlet waveguide in the substrate for controlling the coupling of light from the inlet dielectric waveguide into the outlet waveguide.

7. The optoelectronic device of claim 6 wherein the disk-shaped device is divided into two associated devices having a common I layer and a notched P layer, with one of the associated devices having a relatively larger P layer and the other one of the associated devices having a relatively smaller P layer.

8. The optoelectronic device of claim 7 wherein the other one of the associated devices having a relatively smaller P layer is disposed over or adjacent outlet waveguide disposed in said substrate.

9. The optoelectronic device of claim 6 wherein the disk-shaped device has P, I and N layers, the N layer being adjacent the substrate, and has an annular opening therein which exposes the N layer adjacent the substrate.

10. The optoelectronic device of claim 9 further including contacts formed by metalization layers disposed on the N layer in the annular opening and on the P layer.

11. The optoelectronic device of claim 1 wherein the at least one semiconductor layer comprises P, I and N layers, the N layer being disposed adjacent the substrate, the I layer being disposed on the N layer and the P layer being disposed on the I layer.

12. The optoelectronic device of claim 11 wherein the P and I layers have common widths in a cross section view taken perpendicular to the at least one waveguide and the N layer is wider than said P and I layers in said cross section view taken perpendicular to the at least one waveguide.

13. The optoelectronic device of claim 12 wherein the P and N layers in said cross section view taken perpendicular to the at least one waveguide are essentially centered on said at least one waveguide.

14. The optoelectronic device of claim 11 further including contacts formed by metalization layers disposed on the N layer and on the P layer.

15. The optoelectronic device of claim 11 wherein said N layer includes at least one tapered structure formed of N layer material, at least one tapered structure extending in a direction parallel to said at least one waveguide, the at least one tapered structure also being essentially centered on said at least one waveguide in the cross section view taken perpendicular to the at least one waveguide.

16. The optoelectronic device of claim 1 further comprising a bonding interface layer between the at least one semiconductor layer and the substrate.

17. The optoelectronic device of claim 16 wherein the bonding interface layer comprises: BPSG, BSG, $SiO_2$, SiN or SOG or combinations thereof.

18. The optoelectronic device of claim 16 wherein the bonding interface layer has a thickness and index of refraction adapted to facilitate optical coupling between said at least one semiconductor layer and said at least one waveguide.

19. The optoelectronic device of claim 16 wherein the bonding interface layer improves adhesion between said at least one semiconductor layer and said at least one waveguide.

20. The optoelectronic device of claim 16 wherein said bonding interface layer has an optical refractive index and thickness adapted to facilitate coupling of light between said at least one semiconductor layer and said at least one dielectric waveguide.

21. An optoelectronic device comprising:

a substrate;

at least one dielectric waveguide in the substrate wherein the at least one dielectric waveguide guides light and has at least one input and at least one output; and a plurality of semiconductor elements physically bonded to the substrate and located above a portion of the at least one dielectric waveguide, where light is coupled between said plurality of semiconductor elements and said at least one dielectric waveguide, wherein said plurality of semiconductor elements are electrically active and cooperate with said at least one dielectric waveguide to form an electronically active guided-wave device to generate, absorb, amplify, delay, filter and/or otherwise modulate the amplitude, phase and/or frequency of the light guided through said device, and wherein the light at said at least one output is modulated in amplitude, phase and/or frequency compared to the light at said at least one input.

22. The optoelectronic device of claim 21 wherein each of the plurality of semiconductor elements has adjacent layers of P, I and N material.

23. The optoelectronic device of claim 22 wherein the N material layer is closer to the at least one dielectric waveguide in the substrate than is the P material layer.

24. The optoelectronic device of claim 21 wherein the at least one of the plurality of semiconductor elements is disk-shaped.

25. The optoelectronic device of claim 24 wherein the at least one dielectric waveguide in the substrate includes an inlet waveguide and an associated outlet waveguide.

26. The optoelectronic device of claim 25 wherein the outlet waveguide is arranged close to, but spaced from the inlet waveguide in the substrate and wherein the at least one disk-shaped element is disposed over or immediately adjacent both the inlet waveguide in the substrate and the outlet waveguide in the substrate for controlling the coupling of light from the inlet dielectric waveguide into the outlet waveguide.

27. The optoelectronic device of claim 26 wherein the at least one disk-shaped element is divided into two associated active elements having a common I layer and a notched P layer, with one of the associated active elements having a relatively larger P layer and the other one of the associated active elements having a relatively smaller P layer.

28. The optoelectronic device of claim 27 wherein the other one of the associated active elements having a relatively smaller P layer is disposed over or adjacent outlet waveguide disposed in said substrate.

29. The optoelectronic device of claim 26 wherein the disk-shaped element has P, I and N layers, the N layer being adjacent the substrate, and has an annular opening therein which exposes the N layer adjacent the substrate.

30. The optoelectronic device of claim 29 further including contacts formed by metalization layers disposed on the N layer in the annular opening and on the P layer.

31. The optoelectronic device of claim 21 wherein the at least one semiconductor element comprises P, I and N layers, the N layer being disposed adjacent the substrate, the I layer being disposed on the N layer and the P layer being disposed on the I layer.

32. The optoelectronic device of claim 31 wherein the P and I layers have common widths in a cross section view taken perpendicular to the at least one waveguide and the N layer is wider than said P and I layers in said cross section view taken perpendicular to the at least one waveguide.

33. The optoelectronic device of claim 32 wherein the P and N layers in said cross section view taken perpendicular to the at least one waveguide are essentially centered on said at least one waveguide.

34. The optoelectronic device of claim 31 further including contacts formed by metalization layers disposed on the N layer and on the P layer.

35. The optoelectronic device of claim 31 wherein said N layer includes at least one tapered structure formed of N layer material, at least one tapered structure extending in a direction parallel to said at least one waveguide, the at least one tapered structure also being essentially centered on said at least one waveguide in the cross section view taken perpendicular to the at least one waveguide.

36. The optoelectronic device of claim 21 further comprising a bonding interface layer between the at least one semiconductor element and the substrate.

37. The optoelectronic device of claim 36 wherein the bonding interface layer comprises: BPSG, BSG, $SiO_2$, SiN or SOG or combinations thereof.

38. The optoelectronic device of claim 36 wherein the bonding interface layer has a thickness and index of refraction adapted to facilitate optical coupling between at least one of semiconductor elements and said at least one waveguide.

39. The optoelectronic device of claim 36 wherein the bonding interface layer improves adhesion between said at least one of said semiconductor elements and said at least one waveguide.

40. The optoelectronic device of claim 36 wherein said bonding interface layer has an optical refractive index and thickness adapted to facilitate coupling of light between said at least one of semiconductor elements and said at least one dielectric waveguide.

* * * * *